United States Patent
Funato et al.

(10) Patent No.: US 7,315,173 B2
(45) Date of Patent: Jan. 1, 2008

(54) METHOD OF MEASURING ELECTRIC FIELD DISTRIBUTION AND ELECTRIC FIELD DISTRIBUTION MEASURING INSTRUMENT

(75) Inventors: Hiroki Funato, Yokohama (JP); Takashi Suga, Yokohama (JP); Kouichi Uesaka, Yokohama (JP); Satoshi Nakamura, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/236,733

(22) Filed: Sep. 28, 2005

(65) Prior Publication Data

US 2006/0071669 A1   Apr. 6, 2006

(30) Foreign Application Priority Data

Sep. 29, 2004  (JP) .............................. 2004-283028

(51) Int. Cl.
  G01R 27/04  (2006.01)
  G01R 31/302 (2006.01)
  G01R 29/12  (2006.01)
  G01N 27/60  (2006.01)

(52) U.S. Cl. .................... 324/632; 324/452; 324/457; 324/750

(58) Field of Classification Search ................ 324/457, 324/452, 632
   See application file for complete search history.

(56) References Cited

U.S. PATENT DOCUMENTS

| | | | | |
|---|---|---|---|---|
| 4,314,251 A | * | 2/1982 | Raab ........................... | 342/463 |
| 4,894,607 A | * | 1/1990 | Kumada ........................ | 324/96 |
| 7,141,987 B2 | * | 11/2006 | Hibbs et al. .................. | 324/658 |
| 2003/0118361 A1 | * | 6/2003 | Shimmura .................... | 399/49 |
| 2005/0073322 A1 | * | 4/2005 | Hibbs et al. .................. | 324/658 |
| 2006/0220635 A1 | * | 10/2006 | Kazama et al. ............. | 324/6.11 |

FOREIGN PATENT DOCUMENTS

| | | |
|---|---|---|
| JP | 2002-156430 | 5/2002 |
| JP | 2003-279611 | 10/2003 |
| JP | 2003279611 | * 10/2003 |
| WO | 03/081265 A1 | 10/2003 |

* cited by examiner

*Primary Examiner*—Anjan Deb
*Assistant Examiner*—Jeff Natalini
(74) *Attorney, Agent, or Firm*—Mattingly, Stanger, Malur & Brundidge PC

(57) ABSTRACT

A method and apparatus for measuring an electric field distribution according to the present invention calculates a distribution of electric field intensity and its direction at arbitrary positions on the surface of the electronic apparatus or its circumference with use of data of measurement positions and measurement results of a potential distribution on a surface of an electronic apparatus. Further, it clearly indicates a flow of electromagnetic energy on the surface or in the circumference of the electronic apparatus by applying mathematical treatments to a magnetic field distribution at circumferential positions of the electronic apparatus. Thus, a distribution of high-frequency electric field generated from the electronic apparatus is measured with high accuracy.

6 Claims, 6 Drawing Sheets

$$\vec{E}_{Fm} = \frac{V_{m+1} - V_m}{d}$$

$$\vec{E}_{Sn}(x, y, z) = \vec{f}(V1, V2, x, y, z)$$

METHOD OF MEASURING ELECTRIC FIELD DISTRIBUTION AND ELECTRIC FIELD DISTRIBUTION MEASURING INSTRUMENT

The present application claims priority from Japanese application JP2004-283028 filed on Sep. 29, 2004, the content of which is hereby incorporated by reference into this application.

BACKGROUND OF THE INVENTION

1. Field of the Invention

The present invention relates to a technology for measuring intensity, phase, and direction distributions of electric fields occurring inside or outside a measurement object.

2. Description of the Related Art

In order to identify positions and propagation paths of electromagnetic energy in an electronic apparatus causing malfunctions and the like due to electromagnetic mutual interference, it is required to measure intensity, phase, and direction of electric fields or magnetic fields generated from the electronic apparatus in a two dimensional or three dimensional manner.

Heretofore, the present inventors have invented a magnetic field measuring antenna or a measuring method and apparatus as disclosed in Japanese Patent Laid-open Publication No. 2002-156430 and Japanese Patent Unexamined Publication No. 2003-279611 (and its International Publication WO03/081265 A1). Of the same, the former relates to the magnetic field measuring antenna and the latter relates to the measuring method and apparatus.

In general, when the intensity, phase, and direction of an electric field generated from an electronic apparatus as a measurement object are measured in a two-dimensional or three-dimensional manner, an electric field antenna having directivity and a known antenna coefficient, the coefficient whereby an induced voltage in the antenna and an electric field intensity at the antenna position are mutually related in one-to-one correspondence, is used and the antenna is disposed at an optional measurement position around the measurement object. Thereby, a current or voltage induced in the antenna is measured, and, based on the results of the measurement and the antenna coefficient, a spatial distribution of the electric field intensity and its direction at the measurement position can be obtained. At this time, it is imperative that the disposition of the antenna at the desired measurement position has little effect on the distribution of the electric field generated from the electronic apparatus.

As the antennas for measuring electric field intensity and direction in a space, monopole antennas, dipole antennas, Yagi antennas, and the like are generally used. Of these antennas, dipole antennas and Yagi antennas are difficult to be miniaturized in their physical dimensions and hence difficult to achieve high resolution. Accordingly, monopole antennas that are easily miniaturized have been in use for measurement of electric field distribution around such small-sized electronic devices as LSI chips.

SUMMARY OF THE INVENTION

In order to measure the intensity, phase, and direction of an electric field generated from a measurement object as well as the position of the source of generation, it is generally needed to miniaturize the antenna used for the measurement and bring it close to the measurement object.

However, it has been unavoidable that the accuracy in measurement is lowered when, as in the conventional measurement, a miniaturized electric field antenna is used and it is brought close to a measurement object.

The reason therefor is that the electric field generated by the measurement object is greatly deviated by the electric field antenna that is brought close to the measurement object, as compared with the electric field when there is present no antenna and, consequently, a voltage due to induced charges on the antenna by the potential possessed by the measurement object is produced in the antenna, in excess of the desired induced voltage. This effect becomes more remarkable as the measurement frequency becomes "higher-frequency" to lower the measurement accuracy. A high-frequency range here means a frequency band being 1 GHz or higher.

Further, an electric field antenna having directivity such as monopole antenna exhibits its directivity relative to an electric field by virtue of the antenna configuration. Therefore, changing the size of an antenna requires its re-designing and re-fabrication. Consequently, it becomes difficult to change spatial resolution and achieve high resolution of an antenna dependent on its size.

Further, since an electric field antenna having its directivity in one dimensional or two dimensional directions is generally used, in order to measure an electric field and its direction in three-dimensional space, it is required to measure the electric field distribution for each case where the orientation of the antenna is aligned in each of the three directions of a three-dimensional space, and therefore, it has been difficult to shorten the time for the measurement. As a result, there has been a problem that it was difficult to measure the spatial distribution of an electric field at a high frequency and with a high accuracy and, hence, it has been difficult to identify the source of generation and the path of propagation of electric energy radiated from an electronic apparatus.

The present invention has been made to address the above mentioned problem. Accordingly, an object of the present invention is to achieve measurement of two-dimensional or three-dimensional distribution of electric field intensity, phase, and direction in a high-frequency range with high accuracy.

According to an aspect of the present invention, at first, surface potential distribution (position and potential) of a measurement object is measured with use of a potential sensor made of a metal or the like and these data are recorded in a recording apparatus, associated with each other.

Then, the surface potential distribution data of the measurement object are partially differentiated with respect to the measurement positions to thereby obtain distribution of electric field intensity and direction on the surface of the measurement object.

It is also possible to calculate, from the results of measurement of an electric potential distribution, a spatial distribution of the electric field generated from the measurement object.

Here, the interval of measurement of the surface potential distribution of the measurement object corresponds to the resolution in measurement of the electric field distribution, and therefore it is easy to change the resolution and increase the resolution higher.

Further, the potential distribution has no directivity, and therefore, once the potential distribution on the surface of the measurement object has been measured, electric field distribution in any direction on the surface of the measurement object and at positions near to or far from the measurement object can be calculated, and hence measurement speed also can be increased.

Further, by measuring a spatial distribution of magnetic fields generated from the measurement object, and using these results and the earlier calculated results of the electric field spatial distribution, it is also made possible to calculate a spatial distribution of Poynting vectors indicating flows of electromagnetic energy.

According to the aspect of the present invention, an electromagnetic wave source can be measured in a high-frequency range with a high resolution.

BRIEF DESCRIPTION OF THE DRAWINGS

Embodiments of the present invention will be described in detail based on the following figures, wherein.

DETAILED DESCRIPTION

An embodiment of the present invention will be described with reference to the accompanying drawings.

Figure 1:
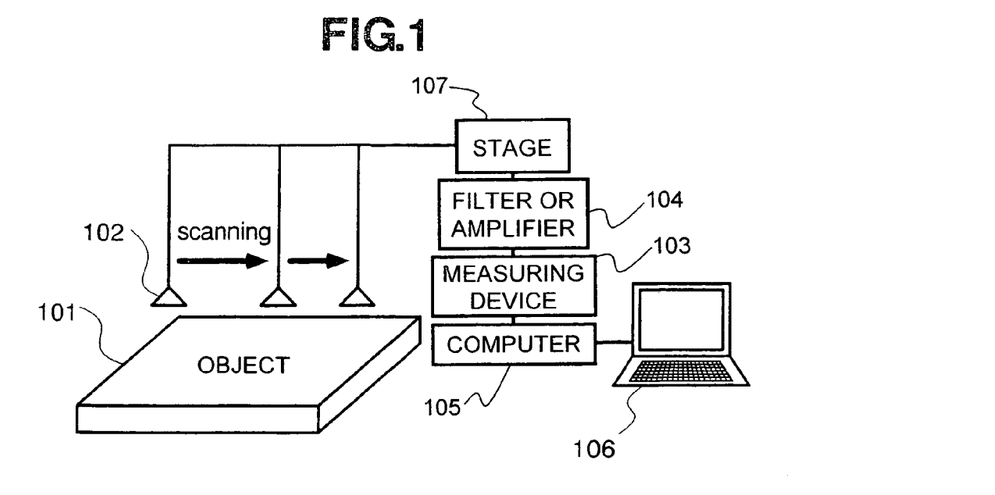
FIG. 1 is a system block diagram of a measuring system.

FIG. 1 shows a system block diagram of a measurement system.

The system as shown in FIG. 1 includes, as its constituent devices, a potential sensor 102 for measuring surface potential of a measurement object 101, a measuring device 103 for measuring a signal from the potential sensor, a filter or an amplifier 104 for changing the signal from the potential sensor into a signal with a desired magnitude or a frequency component, a CPU (a central-processing-unit) for calculating the intensity, phase, and direction of electric fields or Poynting vectors on the surface of the measurement object or an arbitrary point in a space from the results of the surface potential measurement, a computer 105 including a memory and a storage device storing therein programs for use in the above calculations, and the like, a display device 106 for displaying results of measurement, and a stage 107 for controlling the position of the potential sensor.

Here, in order not to disturb the spatial electric field distribution in the vicinity of the measurement object, the potential sensor 102 is required to be spaced apart from the measurement apparatus including the filter or amplifier 104.

Further, the distance at which the potential sensor is electromagnetically disposed in the vicinity of the measurement object is defined as a distance r satisfying $r \leq \lambda/(2\pi)$.

A method of measurement of the present invention will be described below.

First, the surface potential of an electronic device as a measurement object 101 is measured by a stage 107 and a potential sensor 102. At this time, the measured signal is amplified through a filter or amplifier 104 to a desired frequency f component or a desired signal intensity value before being taken into the measuring device. The filter need not necessarily be a band-pass filter but may preferably be a combination of it with a variable high-pass filter or a variable low-pass filter such that the measurement frequency can be set at will. During the surface potential measurement of the measurement object 101, the measurement positions and the results of the potential measurement are continually stored in the storage device of the computer 105. When the physical size of the potential sensor 102 is smaller than the interval of the measurement, the measuring interval at the potential measurement corresponds to the resolution in the calculation of the electric field distribution. Thus, when the potential sensor 102 is scanned within the surface of the measurement object, a stage 107 capable of controlling its position with a higher accuracy than the interval of the measurement is needed.

Figure 2:
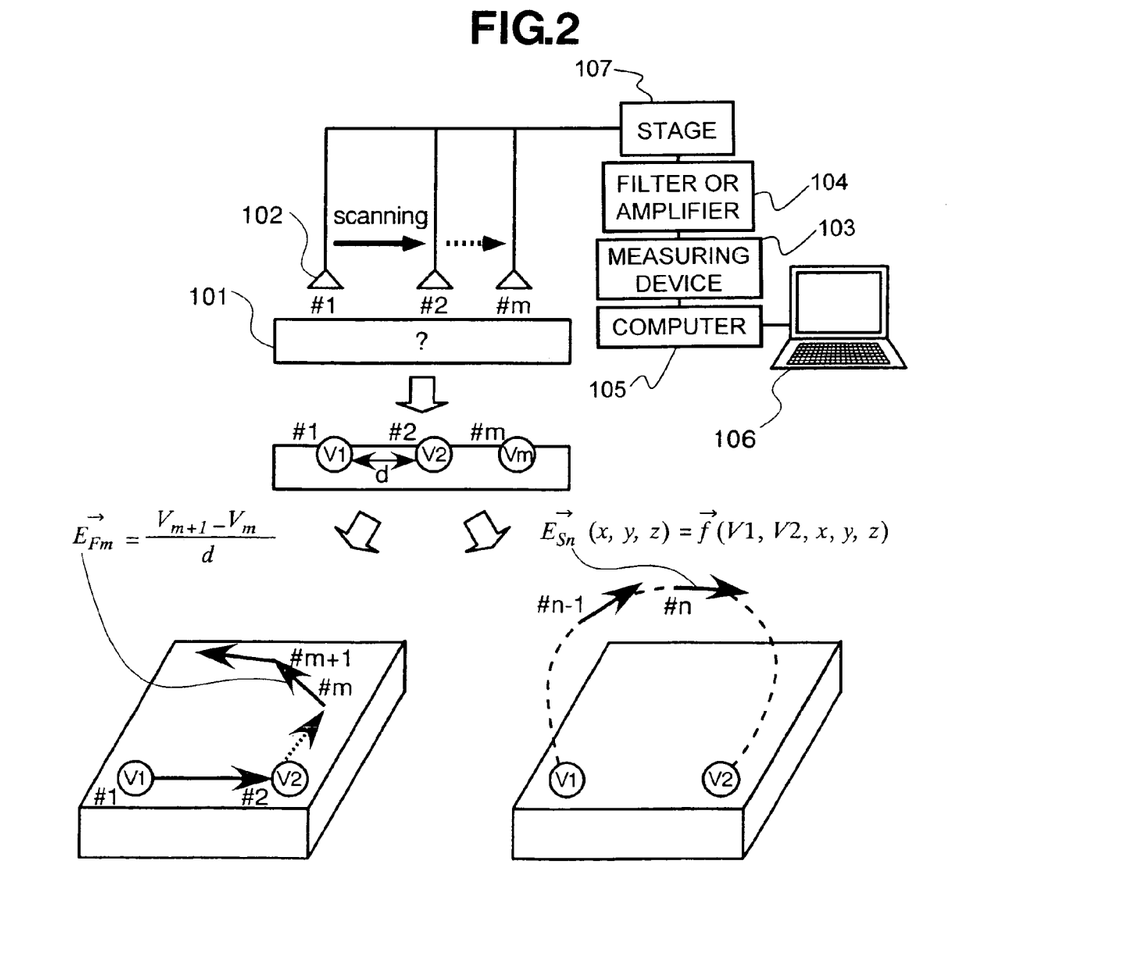
FIG. 2 is a diagram showing a measurement sequence.

Then, by partially differentiating the results of measurement with respect to the position of measurement based on equation 1, the electric field intensity on the surface of the measurement object in any optional direction can be calculated. In the example of FIG. 2, while the potential values at (m+1) points on the surface of the measurement object are measured, the surface electric field Efm existing between the m-th measurement point and the (m+1)-th measurement point is given by dividing the difference between the measured potential values (Vm+1−Vm) by the measurement interval d. At this time, accuracy of the measurement can also be improved by applying curve approximation, with use of a mathematical function, to the results of potential measurement with respect to the measurement position, measurement time, or the measurement frequency.

$$\vec{E} = \nabla \cdot V \qquad \text{[Equation 1]}$$

Further, a spatial distribution of the electric field intensity and direction in positions near to or far from the measurement object can also be calculated from the results of surface potential measurement of the measurement object. In the example of FIG. 2, the electric field Esn at a given point (x, y, z) near to or far from the measurement object can be expressed as a function f(V1, V2, x, y, z) based on the known values of the first measured potential V1 and the second measured potential V2. In the actual measurement, however, contributions by electric fields at all of the measurement points on the surface of the measurement object have to be taken into consideration, and therefore it is necessary that the sum total of the electric field vectors resulting from all of such measurement points are considered.

Further, by measuring a spatial distribution of magnetic field intensity and direction in positions near to or far from the measurement object and thereon by obtaining vector products (Equation 2) of the same and the earlier described spatial distribution of electric field intensity and direction, it is also possible to calculate a spatial distribution of Poynting vectors with respect to intensity and direction and display the results on the display device 106. There are no limitations here in the method for measuring magnetic field in positions near to or far from the measurement object.

Further, in such a case where there are disposed a plurality of electronic devices and each device is generating and radiating an electric field, the use of the present measuring method makes it possible to calculate and display the electric field that is generated only from an electronic device taken as the measurement object by measuring only the surface potential of this electronic device.

$$\vec{P} = \vec{E} \times \vec{H} \qquad \text{[Equation 2]}$$

Figure 3:
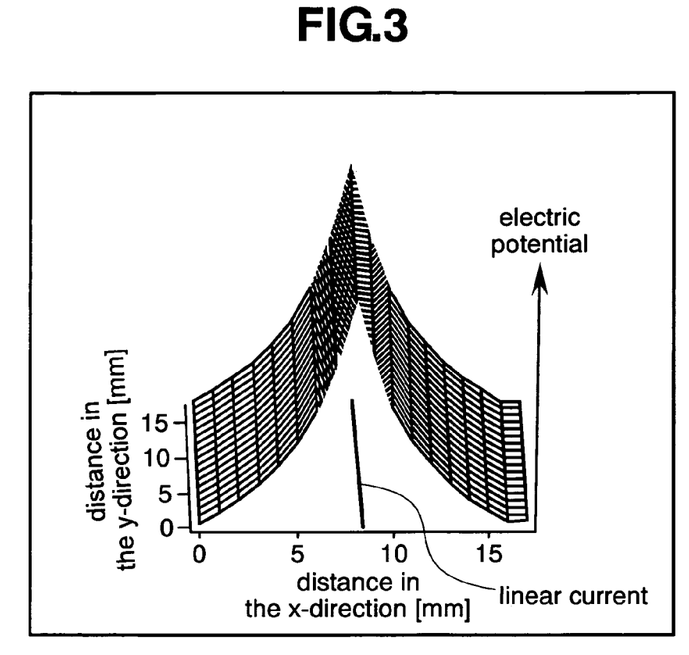
FIG. 3 is a diagram showing an example of calculation of a potential distribution due to a linear current.
Figure 4:
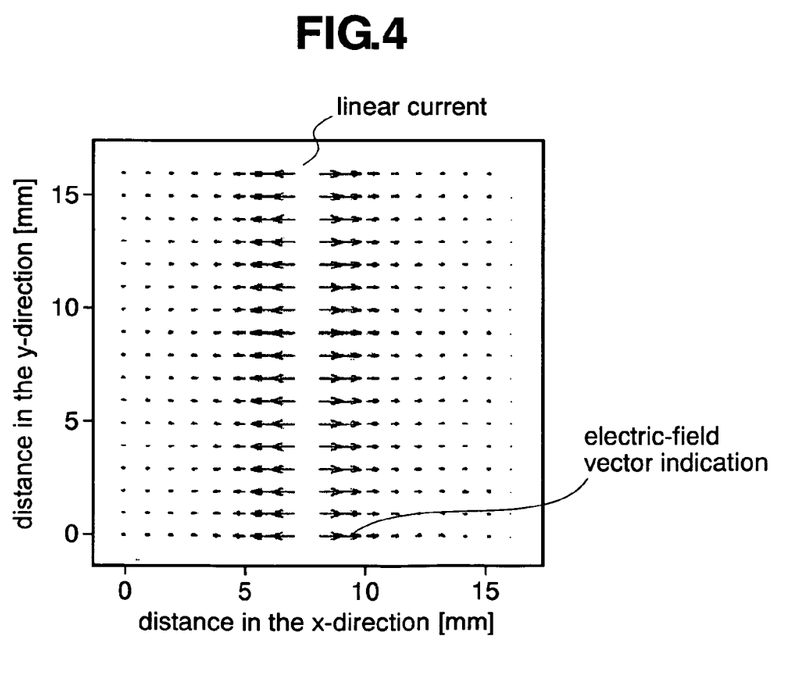
FIG. 4 is a diagram showing an electric field distribution calculated from an electric potential distribution.
Figure 5:
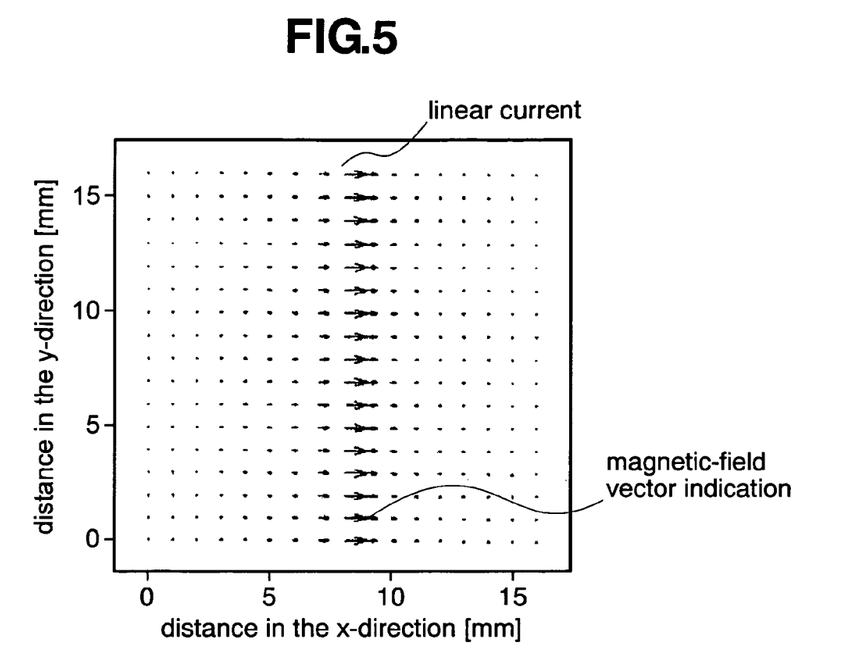
FIG. 5 is a diagram showing a magnetic field distribution due to a linear current.
Figure 6:
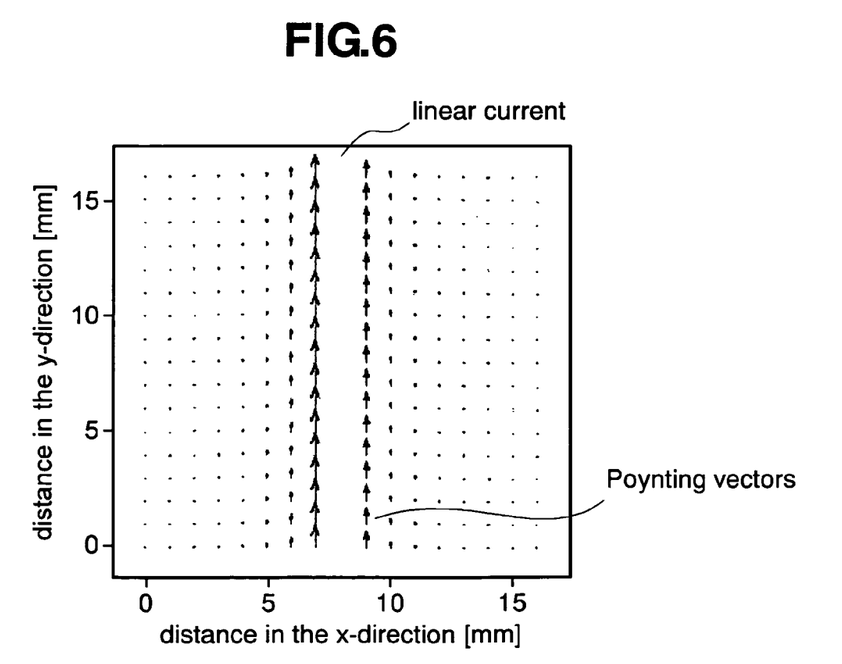
FIG. 6 is a diagram showing a Poynting vector distribution calculated from electric fields and magnetic fields.

Here, an example of calculating a surface potential and a Poynting vector generated by a linear current will be described with reference to FIG. 3-FIG. 6. Let us consider a case where the calculation area is 16 mm×16 mm and a linear current of 1A is flowing in the +Y direction at the position of x=8 mm as shown in FIG. 3. The interval between the points used for the calculation here is set to be 1 mm. In the actual measurement, the interval corresponds to the spatial resolution. FIG. 3 indicates the potential generated by the linear current along the direction of the +z axis. It is seen that the potential is at its maximum at the position just above the linear current (x=8 mm). FIG. 4 shows results of calculation of the distribution of the electric field intensity and the direction obtained by differentiating the above referred potential distribution with respect to the distance in the X-direction and Y-direction. Referring to FIG. 4, the direction of the arrow (so to say, electric field vector) indicates the direction of the electric field and the size of the arrow represents the intensity of the electric field. It is clearly shown that the electric field is at its minimum at the position just above the linear current (x=8 mm) and at its maximum on the left and right (x=7 mm, x=9 mm). Further, there are shown, in FIG. 5, magnetic field vectors, generated by the linear current. Similarly to the above, the direction of the arrow indicates the direction of the magnetic field and the size of the arrow represents the magnetic field intensity. It can be seen that the magnetic field is at its maximum in the vicinity of the position just above the linear current. FIG. 6 shows a distribution of Poynting vectors calculated from the above electric field vectors and magnetic field vectors. Similarly to the above, the direction of the arrow indicates the direction of the Poynting vector and the size of the arrow represents the Poynting vector intensity. It is seen that the Poynting vectors are aligned in the +y direction along the linear current. This clearly indicates that the electromagnetic energy is propagating in the +y direction along the linear current.

Figure 7:
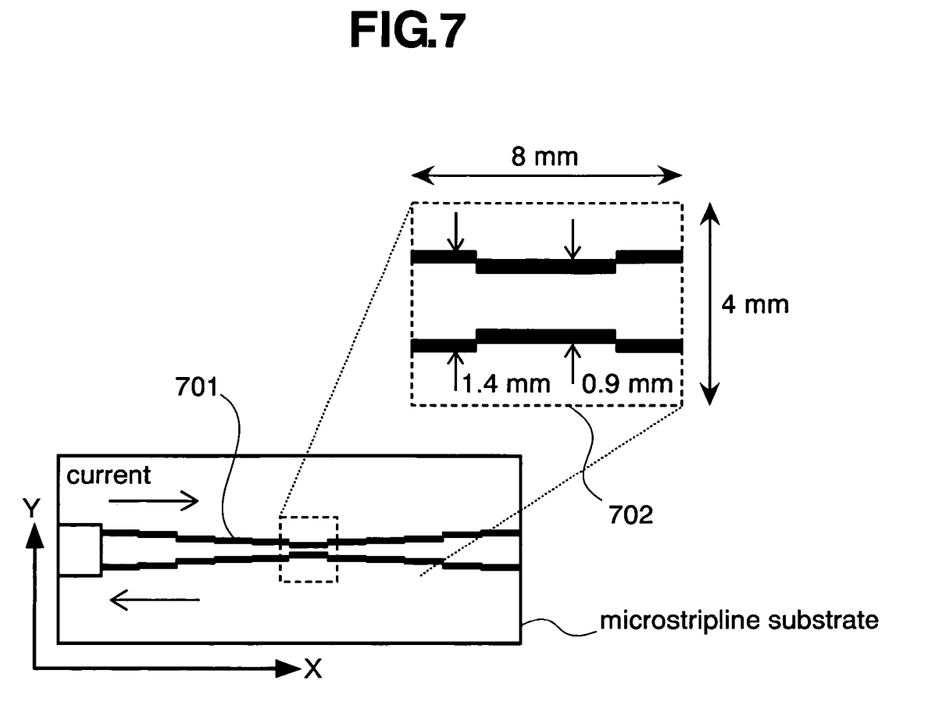
FIG. 7 is a diagram showing a measurement object.
Figure 8:
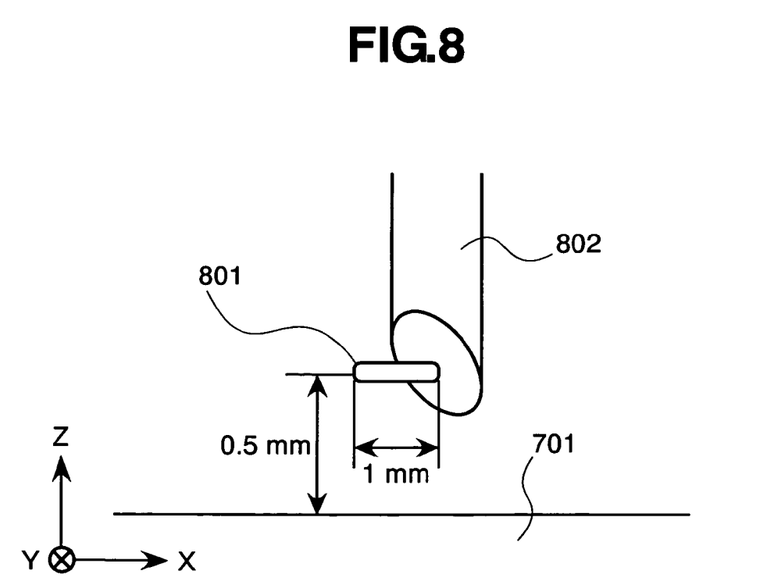
FIG. 8 is a diagram showing a potential sensor used in the measurement.

Here, with use of FIG. 7 to FIG. 10, an example of surface potential measurement in a high-frequency range will be shown. FIG. 7 shows a microstripline substrate (a substrate having microstrip lines 701 formed thereon). A measurement region 702 is defined by an area of 8 mm×4 mm as shown in FIG. 7. The measurement interval is set to 0.5 mm×0.25 mm. The microstrip line 701 has a line width of 0.4 mm. The end of the line is left open. A semirigid cable 802 with its core wire 801 opened by 1 mm as shown in FIG. 8 was used as a potential sensor 101. With the end of the semirigid cable 802 opened 1 mm, when it is brought very close to a measurement object, electric charges corresponding to the electric charge quantity of the measurement object are induced in the core wire portion 801, whereby its function as the potential sensor 102 as shown in FIG. 1 and FIG. 2 is performed. Here, the height of the potential sensor 102 in the z-direction with respect to the microstrip lines 701 as the measurement object 101 was set at a constant height of 0.5 mm.

Further, the measuring frequency here was set to 1.0 GHz and a network analyzer was used as the measuring device 103. Since the network analyzer can measure only a desired frequency with high sensitivity, the filter or amplifier 104 was not used.

Figure 9:
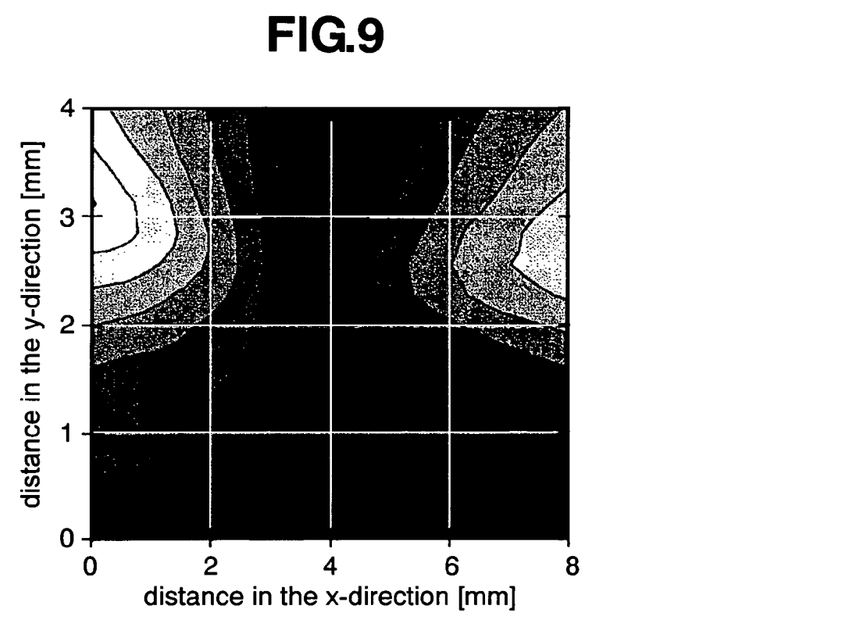
FIG. 9 is a diagram showing a measurement result of a potential distribution.

FIG. 9 shows results of measurement of a surface potential distribution in the measurement region 702. Here, there is present a potential only in the microstrip line 701 disposed on one side because the end of the microstrip line 701 is opened.

Figure 10:
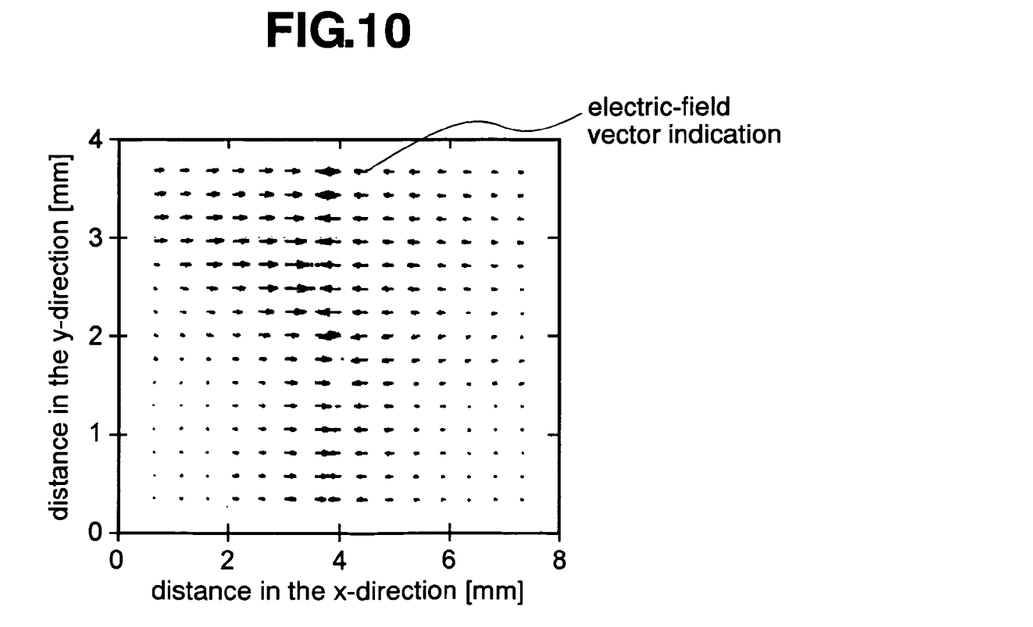
FIG. 10 is a diagram showing an electric field distribution calculated from the measurement result of a potential distribution.

Results of calculation of the surface electric field distribution on the measurement object from the above described results of the measurement of potential distribution are shown in FIG. 10. In FIG. 10, the direction of the arrow indicates the direction of the electric field and the size of the arrow represents the intensity of the electric field. As shown in FIG. 10, the electric field assumes its maximum at the trough (or the valley) of the standing wave present on the microstrip line and there is clearly shown the electric field distribution directed from the peak to the trough.

In the setup example as above, a semirigid cable 802 was used as the potential sensor 102. However, the type of the sensor 102 or means for potential measurement is not limited to that. If it is capable of inducing electric charges corresponding to the potential of the measurement object, a micro-conductor may be used as the potential sensor. Otherwise, a device with a sensor capable of sensing atomic force between it and the measurement object may be used for measuring the surface potential of the measurement object 101.

Although the method for calculating the electric field distribution or Poynting vector distribution through partial differential calculation or calculating outer product (cross product) with magnetic field distribution after acquisition of the measured surface potential distribution by the computer 105 has been described above, the sequence and method of calculations are not limited to those described above. Namely, calculations, when the data are taken into the measuring device, may be performed through hardware processing with use of electric circuits and the like.

Although examples in which the electric field and the magnetic field generated from the measurement object are individually measured have been described above, such a configuration may also be used as to measure the surface electric field distribution of the measurement object 101 and the magnetic field distribution in its vicinity at the same time with use of a probe in which a potential sensor 102 and a magnetic field measuring antenna are formed integral.

Figure 11:
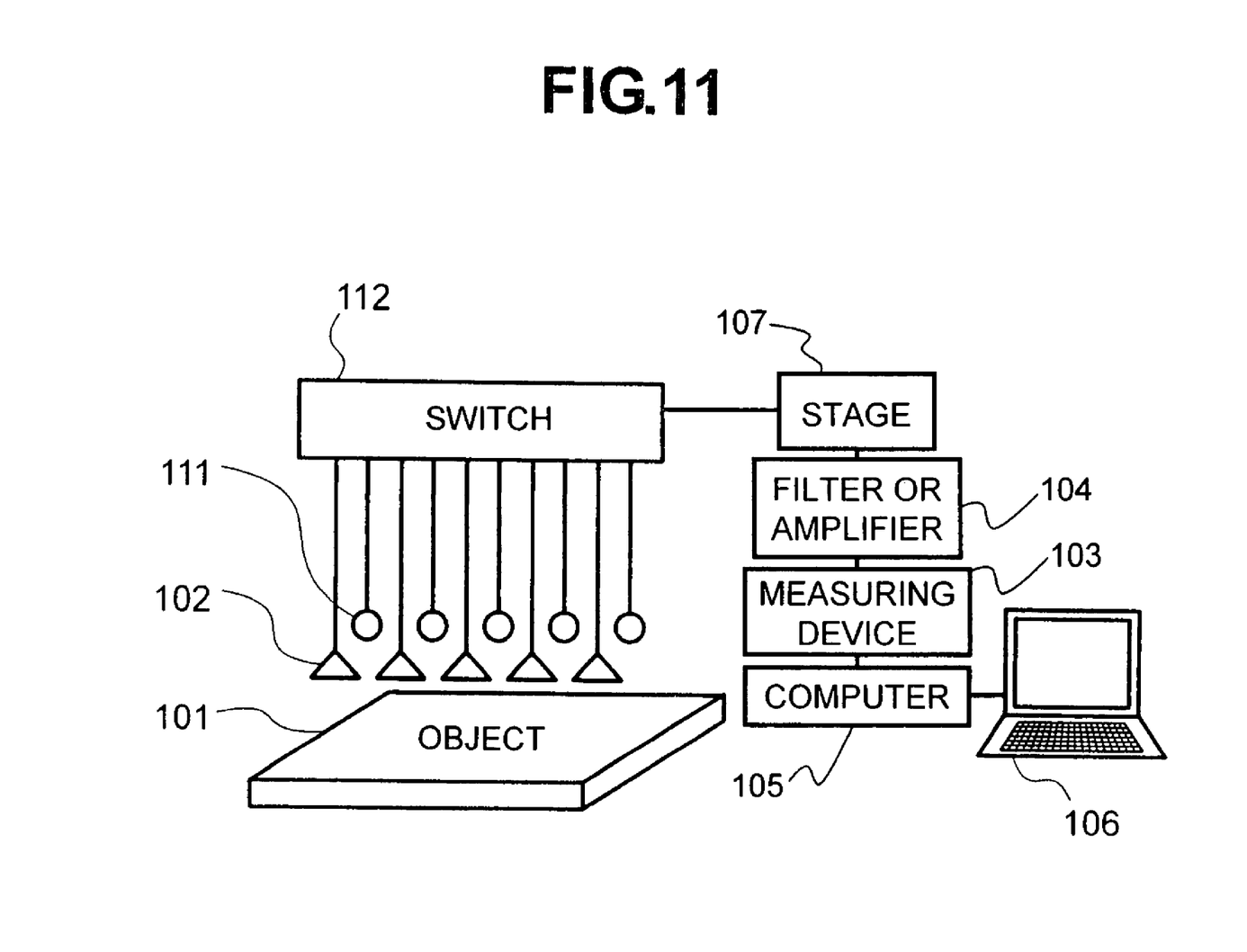
FIG. 11 is a diagram showing a measurement apparatus.

Further, it is also possible to use an array antenna, made up of a plurality of electric potential sensors 102 or probes formed of pluralities of electric potential sensors 102 and magnetic field measuring antennas 111 in combination as shown in FIG. 11, together with a switch 112 for switching one to another, to thereby obtain two- or three-dimensional electric potential and magnetic data at the same time for shortening the measurement time. However, if a plurality of antennas are used in combination, it is possible that the measurement accuracy or the stability of the measurement system is deteriorated by mutual interference. If this is considered, measurement with use of one probe is preferred.

Although examples in which the measurement frequency was fixed have been described so far, it is also possible to search the frequency characteristic of spatial distribution of the electric fields and spatial distribution of the Poynting vectors by sweeping the frequency to be measured on the filter and the measuring device sides. Further, by measuring temporal change in the surface potential distribution, temporal change in spatial distribution of the electric fields and spatial distribution of the Poynting vectors may be displayed.

Further, it may be practiced, before carrying out series of measurements described so far, to measure the frequency characteristic and transmission and/or reflection characteristic of the amplifier or filter 104, stage 108, potential sensor 102, the magnetic field measuring antenna, and the like, and then use the results thus obtained for correcting the results of measurement of the surface potential of the measurement object. Thereby, the accuracy in the measurement can be improved.

Further, in addition to the results of measurement described so far, a spatial distribution of vector potentials may be calculated from the spatial electric field distribution with use of Equation 3. By displaying the thus obtained results on the display apparatus 106, a distribution of spatially existing electromagnetic energy may be indicated.

$$\nabla \times \vec{E} = -\frac{\partial}{\partial t}(\nabla \times \vec{A})$$ [Equation 3]

When a spatial distribution of magnetic fields is used in the calculation as described above, it need not be limited to results of measurement obtained with the use of a magnetic field antenna. An electric current distribution on the surface of the measurement object may be calculated from results of measurement of a surface potential distribution on the measurement object and an impedance distribution on the surface of the measurement object, and from this electric current distribution, the spatial magnetic field distribution near to or far from the measurement object may be calculated.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A method for measuring electric field distribution, for use in an electric field distribution measurement apparatus for obtaining electric field intensity and direction generated from a measurement object, comprising:
   measuring a surface potential on the measurement object with a potential sensor;
   recording the surface potential as a result of the measurement in association with a measurement position; and
   calculating electric field intensity and a direction of the electric field at an arbitrary position on a surface of the measurement object from the position on the surface and the surface potential at the position.

2. The method for measuring electric field distribution according to claim 1, wherein measured data are passed through a filter or an amplifier so as to be given a specific desired frequency component.

3. The method for measuring electric field distribution according to claim 1, wherein intervals are set up for measuring electric field distribution on the measurement object.

4. The method for measuring electric field distribution according to claim 1, wherein, three-dimensional spatial potential values at circumferential positions of the measurement object are measured, whereupon a distribution of electric field intensity and direction at an arbitrary position of the circumferential positions of the measurement object is calculated with use of the results of the spatial potential measurement and data of the measurement positions.

5. The method for measuring electric field distribution according to claim 1, wherein a plurality of the potential sensors are arranged in an array for measuring the surface potential.

6. The method for measuring electric field distribution according to claim 1, wherein the potential sensor is a semi-rigid cable.

* * * * *